(12) United States Patent
Choi

(10) Patent No.: US 7,403,445 B2
(45) Date of Patent: Jul. 22, 2008

(54) CONFIGURATION OF MEMORY DEVICE

(75) Inventor: Jung-hwan Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 294 days.

(21) Appl. No.: 11/393,627

(22) Filed: Mar. 30, 2006

(65) Prior Publication Data

US 2006/0245267 A1 Nov. 2, 2006

(30) Foreign Application Priority Data

May 2, 2005 (KR) ...................... 10-2005-0036686

(51) Int. Cl.
*G11C 8/00* (2006.01)
(52) U.S. Cl. ............................. 365/230.08; 365/189.04; 365/233.12
(58) Field of Classification Search ............ 365/189.03, 365/189.04, 230.085, 189.12, 233.11, 233.12, 365/233.16, 233.17
See application file for complete search history.

(56) References Cited

U.S. PATENT DOCUMENTS

| 5,604,710 | A | * | 2/1997 | Tomishima et al. .... | 365/230.03 |
| 5,982,674 | A | * | 11/1999 | Lines et al. ............ | 365/189.02 |
| 6,147,924 | A | * | 11/2000 | Lee et al. ............... | 365/230.03 |
| 2004/0027857 | A1 | | 2/2004 | Ooishi .................... | 365/185.11 |
| 2004/0133736 | A1 | | 7/2004 | Kyung | |

FOREIGN PATENT DOCUMENTS

| JP | 07-262769 | 10/1995 |
| KR | 10-0188016 | 1/1999 |
| KR | 10-2004-0062717 | 9/2004 |

\* cited by examiner

*Primary Examiner*—Son T Dinh
*Assistant Examiner*—Hien N Nguyen
(74) *Attorney, Agent, or Firm*—Mills & Onello LLP

(57) ABSTRACT

In an improved construction of a memory device, the memory device includes a first group of pins via which a command/address signals are received and via which data signals are received, and a second group of pins via which the command/address signals are received and via which data signals are output. When the data signals are input to the first group of pins, the command/address signals are received via the second group of pins. When the data signals are output from the second group of pins, the command/address signals are received via the first group of pins.

20 Claims, 3 Drawing Sheets

CONFIGURATION OF MEMORY DEVICE

CROSS-REFERENCE TO RELATED PATENT APPLICATIONS

This application claims the priority of Korean Patent Application No. 10-2005-36686, filed on May 2, 2005, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to data input/output pins and command and address input pins of a memory device.

2. Description of the Related Art

A conventional semiconductor memory device such as a DRAM includes address pins A, command pins C, and pins DQ via which data is input or output.

FIG. 1 is a schematic block diagram of a conventional memory device 100. The conventional memory device 100 includes a memory core 101, a write/read pipeline unit 103, a command and address decoder (command/address decoder) 105, a clock buffer 107, and an input/output (I/O) buffer 115. The I/O buffer 115 includes a data input buffer 109, a command and address input buffer 111, and a data output buffer 113. The I/O buffer 115 further includes a plurality of command and address input pins 117 connected to the command and address (command/address) input buffer 111, chip selection (CS) pins 119 connected to the command and address decoder 105, data I/O (DQ) pins 121 connected to the data input buffer 109 and the data output buffer 115, and a clock input (CLK) pin 123 through which a clock signal is input to the conventional memory device 100.

In the conventional memory device 100, the command and address input pins (command/address pins) 117 are separated from the data input pins 121. That is, the command and address input pins 117 are used to receive and transmit only external command and address signals, and the data I/O pins 121 are used to receive and output only data.

As illustrated in FIG. 1, the conventional memory device 100 selectively performs exclusively a read operation or a write operation at a specific instant in time. That is, the conventional memory device 100 is not capable of receiving data simultaneously with outputting data via the data I/O pins 121 at a specific instant in time.

Of course, both the read and write operations can be simultaneously performed in response to a proper combination of commands in the conventional memory device 100. However, since inputting of data to the I/O pins 121 for the read operation is not performed concurrently with outputting of data from the data I/O pins 121 for the read operation, the write operation must be performed following the read operation, or the read operation must be performed following the write operation. In other words, the data I/O pins 121 experience a time gap between the write operation and the read operation during which they are dormant. In the conventional memory device 100, after one of the read operation and the write operation is completed, the other can be performed, and thus, the switching between read and write operations can have a negative effect on data processing speed and overall system efficiency.

To increase the speed of inputting/outputting data, it has been suggested that the data I/O pins DQ be divided into data input pins D and data output pins Q and that they be configured independently of each other so as to receive and output data via different pins. In this case, since data is received and output using different signal lines, the time difference between data input and data output operations is reduced, thereby enabling the memory device 100 to very effectively process the data. However, since all command and address input pins, data output pins, and data input pins are required, that is, a large number of pins are required, such a configuration leads to semiconductor module design problems owing to the high pin count.

SUMMARY OF THE INVENTION

The present invention provides a semiconductor memory device in which input/output (I/O) pins and an I/O buffer are organized in a manner so as to increase system efficiency.

The present invention also provides a semiconductor memory device capable of receiving and outputting data at a high speed, without increasing the required number of pins.

In one aspect, the present invention is directed to a semiconductor memory device comprising: a first group of pins via which command/address signals are received and via which data signals are received; and a second group of pins via which command/address signals are received and via which data signals are output. When data signals are input to the first group of pins, the command/address signals are input to the second group of pins, and when data signals are output from the second group of pins, the command/address signals are input to the first group of pins.

In one embodiment, the semiconductor memory device further comprises: a first command/address input buffer receiving the command/address signals via the first group of the pins; a second command/address input buffer receiving the command/address signals via the second group of the pins; a data input buffer receiving the data signals via the first group of the pins; and a data output buffer outputting the data signals via the second group of the pins.

In another embodiment, the semiconductor memory device further comprises; a memory core including a memory cell array and a sense amplifier; a command/address decoder decoding a signal input to or output from the command/address input buffer; and a write/read pipeline unit transmitting signals input to or output from the data input buffer and the command/address decoder to the memory core, and transmitting data signals received from the memory core to the data output buffer.

In another embodiment, the semiconductor memory device of claim 1, further comprises: a command/address input buffer receiving the command/address signals via one of the first group of pins and the second group of pins; a data input buffer receiving the data signals via the first group of pins; and a data output buffer outputting the data signals via the second group of pins.

In another aspect, the present invention is directed to a semiconductor memory device comprising: a data input buffer receiving external data signals to be written to the semiconductor memory device; a data output buffer outputting data signals read from the semiconductor memory device; and a command/address input buffer receiving command/address signals input to the semiconductor memory device. Both the data input buffer and the command/address input buffer receive data signals and control/address signals respectively on a common, first group of pins.

In one embodiment, when data signals are output from the data output-buffer, the first group of pins are used to receive the command/address signals.

In another embodiment, the data input buffer and the command/address input buffer comprise a common input buffer.

In another embodiment, the semiconductor memory device further comprises: a memory core including a memory cell array and a sense amplifier; a command/address decoder decoding signals input to or output from the command/address input buffer; and a write/read pipeline unit transmitting signals input to or output from the data input buffer and the command/address decoder to the memory core, and transmitting data signals received from the memory core to the data output buffer.

In another aspect, the present invention is directed to a semiconductor memory device comprising: a data input buffer receiving external data signals to be written to the semiconductor memory device; a data output buffer outputting data signals read from the semiconductor memory device; and a command/address input buffer receiving command/address signals input to the semiconductor memory device. Both the data output buffer and the command/address input buffer output data signals and receive command/address signals respectively on a common, first group of pins.

In one embodiment, when data signals are input to the data input buffer, the first group of pins are used to receive the command/address signals.

In another embodiment, each of the data input buffer and the command/address input buffer comprise a common input buffer.

In another embodiment, the semiconductor memory device further comprises: a memory core including a memory cell array and a sense amplifier; a command/address decoder decoding signals input to or output from the command/address input buffer; and a write/read pipeline unit transmitting signals input to or output from the data input buffer and command/address decoder to the memory core, and transmitting data signals received from the memory core to the data output buffer.

In another aspect, the present invention is directed to a semiconductor memory device comprising: a data input buffer receiving external data signals to be written to the semiconductor memory device; a data output buffer outputting data signals read from the semiconductor memory device; and a first command/address input buffer and a second command/address input buffer receiving command/address signals input to the semiconductor memory device. Both the data input buffer and the first command/address input buffer receive data signals and command/address signals respectively on a common, first group of pins, and both the data output buffer and the second command/address input buffer output data signals and receive command/address signals respectively on a common, second group of pins.

In one embodiment, when data signals are received via the first group of pins; the command/address signals are received via the second group of pins, and when data signals are output via the second group of pins, the command/address signals are received via the first group of pins.

In another embodiment, the semiconductor memory device further comprises: a memory core including a memory cell array and a sense amplifier; a command/address decoder decoding signals input to or output from the first and second command/address input buffers; and a write/read pipeline unit transmitting signals input to or output from the data input buffer and the command/address decoder to the memory core, and transmitting data signals received from the memory core to the data output buffer.

In another aspect, the present invention is directed to a semiconductor memory device comprising: a data input buffer receiving external data signals to be written to the semiconductor memory device; a data output buffer outputting data signals read from the semiconductor memory device; a command/address input buffer receiving command/address signals input to the semiconductor memory device; a first group of pins via which the command/address signals are received and via which data signals are received; and a second group of pins via which the command/address signals are received and via which data signals are output. The command/address input buffer selectively receives the command/address signals received via one of the first group of pins and the second group of pins, the first group of pins are connected to the data input buffer and the command/address input buffer, and the second group of pins are connected to the data output buffer and the command/address input buffer.

In one embodiment, when the data signals are received via the first group of pins, the command/address signals are received via the second group of pins, and when the data signals are output via the second group of pins, the command/address signals are received via the first group of pins.

In another embodiment, each of the data input buffer and the command/address input buffer comprises a common input buffer.

In another embodiment, the semiconductor memory device further comprises: a memory core including a memory cell array and a sense amplifier; a command/address decoder decoding signals input to or output from the command/address input buffer; and a write/read pipeline unit transmitting signals input to or output from the data input buffer and the command/address decoder to the memory core, and transmitting data signals received from the memory core to the data output buffer.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

Figure 1:
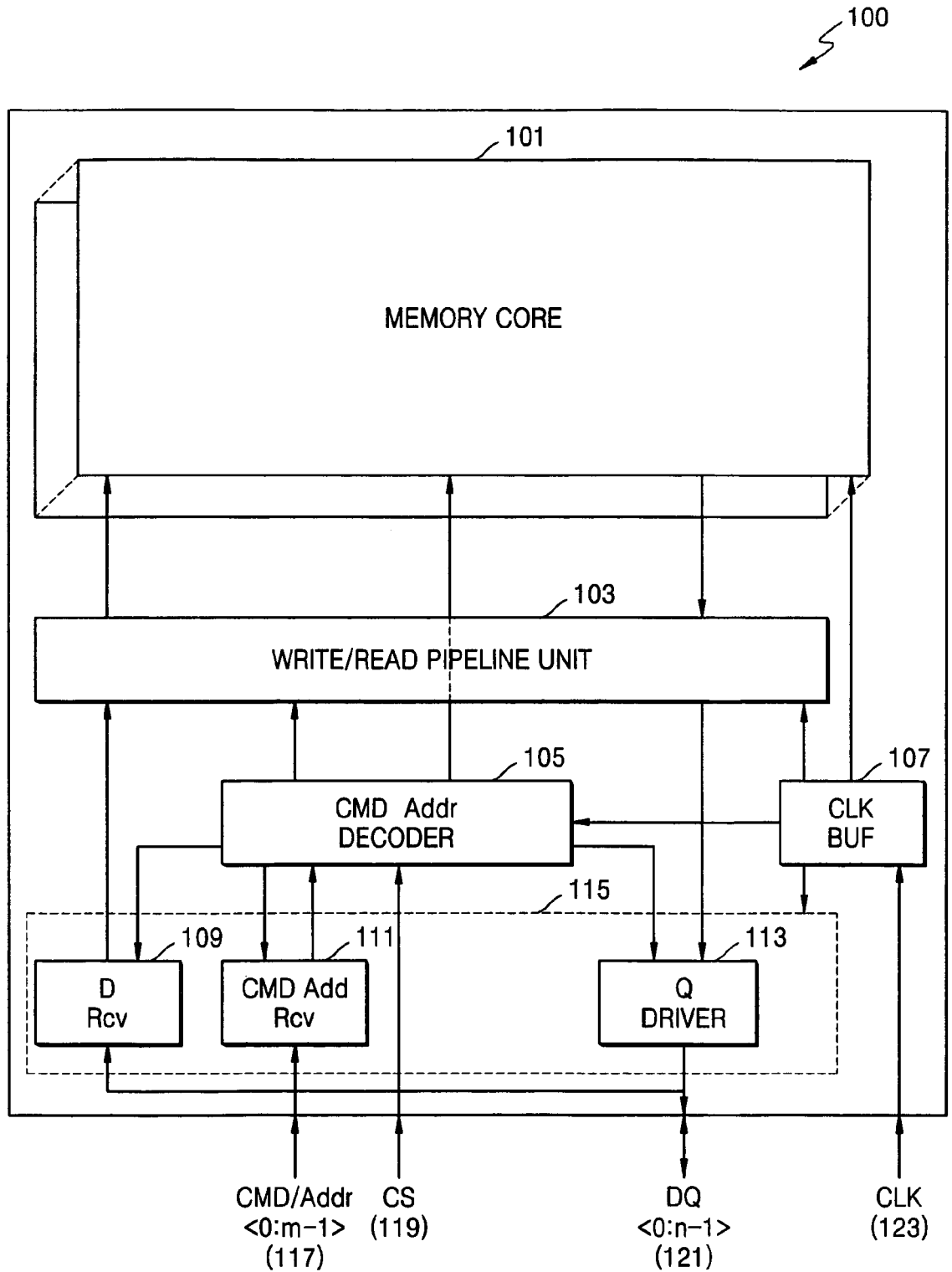
FIG. 1 is a schematic block diagram of a conventional semiconductor memory device.

Hereinafter, exemplary embodiments of the present invention will be described in detail with reference to the accompanying drawings. Like reference numerals designate like elements throughout the specification and drawings.

Figure 2:
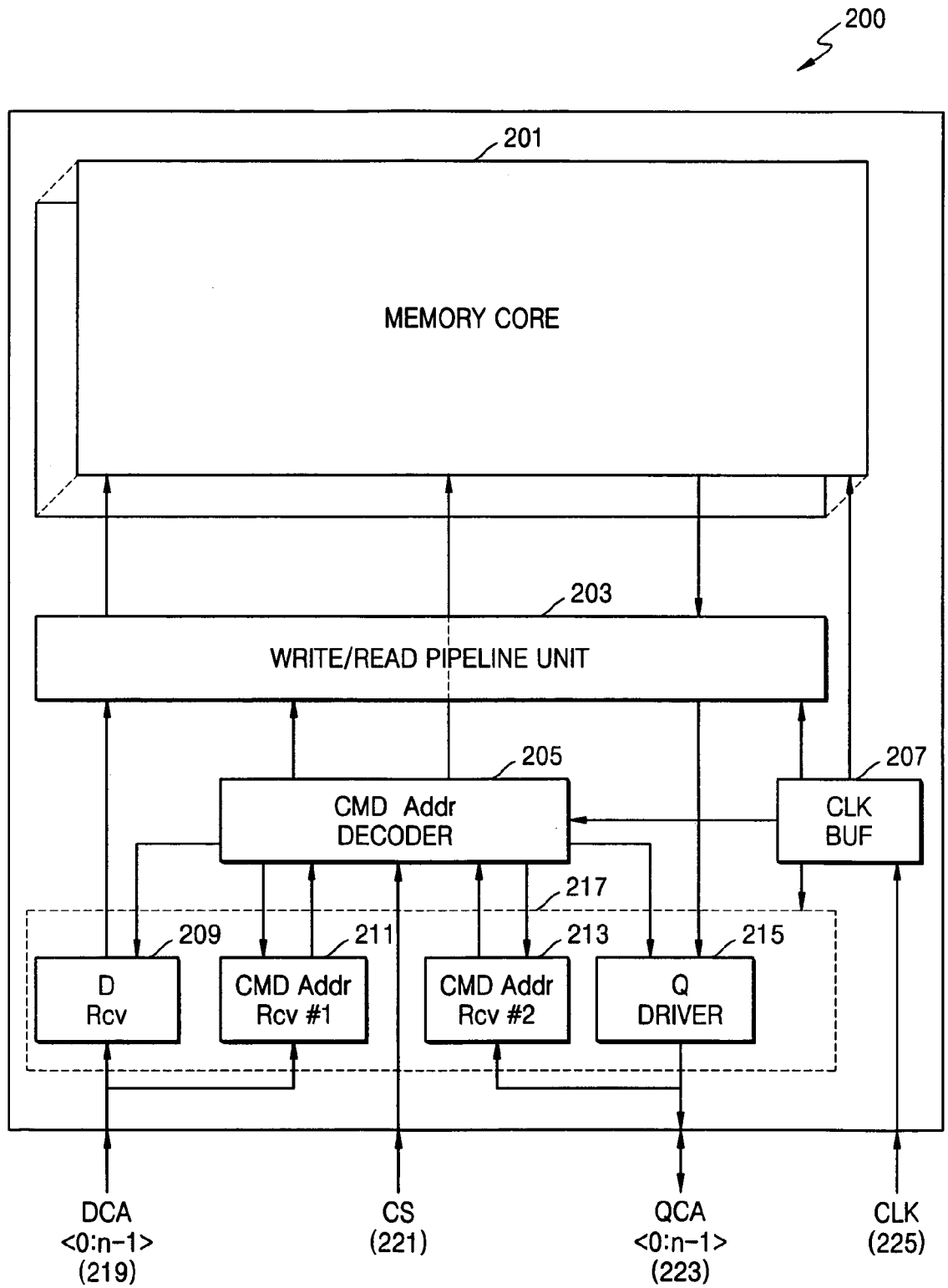
FIG. 2 is a schematic block diagram of a semiconductor memory device according to an embodiment of the present invention.

FIG. 2 is a block diagram of a memory device 200 according to an embodiment of the present invention. The memory device 200 includes a memory core 201, a write/read pipeline unit 203, a command and address decoder 205, a clock buffer 207, and an input/output (I/O) buffer 217.

The I/O buffer 217 includes a data input buffer 209, a first command and address input buffer 211, a second command and address input buffer 213, and a data output buffer 215.

The memory device 200 further includes a first group of DCA<0:n−1> pins 219 via which data signals are input, and command and address signals are input; chip selection (CS) pins 221; a second group of QCA<0:n−1> pins 223 via which data signals are output, and command and address signals are input; and clock (CLK) input pins 225.

The DCA pins 219 are connected to the data input buffer 209 and the first command and address input buffer 211. A data signal input to the DCA pins 219 is transmitted to the data input buffer 209, and command and address signals input to the DCA pins 219 are transmitted to the first command and address input buffer 211.

The QCA pins 223 are connected to the data output buffer 215 and the second command and address input buffer 213. Command and address signals input to the QCA pins 223 are transmitted to the second command and address input buffer 213, and a data signal output from the data output buffer 215 is output via the QCA pins 223.

The CS pin 221 receives a chip selection signal CS and transmits it to the command and address decoder 205. The CLK input pin 225 transmits a clock signal CLK to the clock buffer 207.

The memory core 201 is a memory block having a memory bank array and a sense amplifier. The write/read pipeline unit 203 is located among the I/O buffer 217, the command and address decoder 205, the clock buffer 207, and the memory core 201 so as to allow exchange of data therebetween. The command and address decoder 205 decodes first and second commands, and command and address signals received from the first and second address input buffers 211 and 213, and outputs the results of decoding to each element of the memory device 200. The clock buffer 207 buffers an external clock signal CLK and transmits the result of buffering to each element of the semiconductor device 200.

The data input buffer 209 receives data to be written to the memory core 201 and transmits it to the memory device 200. The data output buffer 215 receives data read from the memory core 201 and outputs the read data.

When not receiving data, the first command and address input buffer 211 receives command and address signals via the DCA pins 219 and transmits them to the command and address decoder 205.

When not receiving data, the second command and address input buffer 213 receives command and address signals via the QCA pins 223 and transmits them to the command and address decoder 205.

Accordingly, it is possible to receive the command and address signals via the QCA pins 223 while receiving data to be written to a memory cell, and it is also possible to receive the command and address signals via the DCA pins 219 while outputting data read from the memory cell.

In other words, when a write operation is performed on the memory cell, the command and address signals required for the write operation are received via the QCA pins 223 and the data to be written is received via the DCA pins 219. Conversely, when a read operation is performed on the memory cell, the command and address signals required for the read operation are received via the DCA pins 219 and the data read from the memory cell is output via the QCA pins 223.

Accordingly, since pins via which data are input and output are unified with pins via which command and address signals are received in the present invention, the total number of pins required in the configuration of the present invention is less than that of the number of pins required in the conventional semiconductor memory device having divided data input pins D and data output pins Q. In addition, prior to completing a write or read operation, it is possible under the configuration of the present invention to input command and address signals required for a subsequent operation to pins to which command and address signals are presently not being input, thereby increasing the efficiency of each channel. The efficiency of DCA and QCA channels can also be increased by properly defining commands that are transmitted via the command and address signals.

Figure 3:
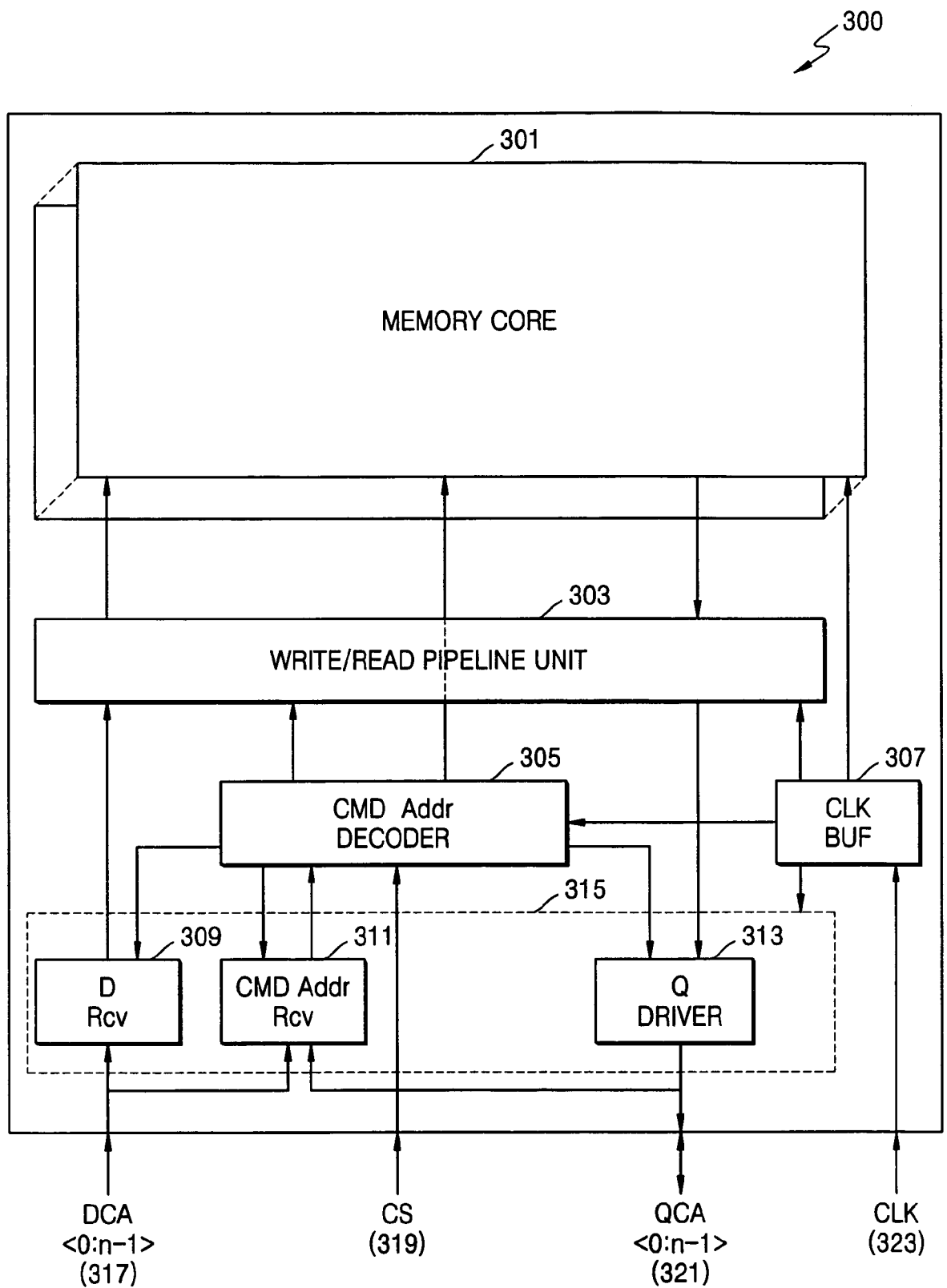
FIG. 3 is a schematic block diagram of a semiconductor memory device according to another embodiment of the present invention.

FIG. 3 is a schematic block diagram of a semiconductor memory device 300 according to another embodiment of the present invention. The construction of the memory device 300 is similar to that of the memory device 200 illustrated in FIG. 2, except that in the configuration of FIG. 3, a common command and address input buffer 311 performs the operations of both the first and second command and address input buffers 211 and 213 of the configuration of FIG. 2. The command and address input buffer 311 can optionally include a multiplexer (not shown) at an input terminal thereof, that selectively transmits first command and address signals received via DCA pins 317, or first command and address signals received via QCA pins 321.

For a write operation, command and address signals required for the write operation are received via the QCA pins 321 and data to be written to a memory cell (not shown) is received via the DCA pins 317. Then, the data received via the DCA pins 317 is buffered by a data input buffer 309, and the buffered data is transmitted to a write/read pipeline unit 303. Also, the command and address signals received via the QCA pins 321 are buffered by the command and address input buffer 311, and the buffered command and address signals are transmitted to a command and address decoder 305.

For a read operation, command and address signals required for the read operation are received via the DCA pins 317 and data read from the memory cell is output via the QCA pins 321. Then, the command and address signals received via the DCA pins 317 are buffered by the command and address input buffer 311 and the buffered command and address signals are transmitted to the command and address decoder 305. Also, the data read from a memory core 301 is transmitted to a data output buffer 313 via write/read pipeline unit 303 and buffered by the data output buffer 313. The buffered read data is output via the QCA pins 321.

In this configuration, data to be written to the memory core 301 can be received via the DCA pins 317 while receiving command and address signals required for a subsequent read/write operation to be performed after the write operation, via the QCA pins 321. Further, read data can be output via the QCA pins 321 while receiving command and address signals required for a subsequent read/write operation to be performed after the read operation, via the DCA pins 317.

In an alternative embodiment, the data input buffer 309 and the command and address input buffer 311 can be implemented as a single, common, input buffer. In this case, it is possible to selectively receive signals via a multiplexer (not shown), thereby simplifying the internal circuit construction of the memory device.

As described above, as compared to a conventional semiconductor memory device in which the data input pins D and data output pins Q are separated, a semiconductor memory device according to the present invention requires a relatively small number of pins, and unifies at least a subset of pins via which data is input and output with a least a subset of pins via which command and address signals are received, thereby increasing system efficiency.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor memory device comprising:
 a first group of pins via which command/address signals are received and via which data signals are received; and a second group of pins via which command/address signals are received and via which data signals are output, wherein when data signals are input to the first group of pins, the command/address signals are input to the second group of pins, and wherein when data signals are output from the second group of pins, the command/address signals are input to the first group of pins.

2. The semiconductor memory device of claim 1, further comprising:

a first command/address input buffer receiving the command/address signals via the first group of the pins;

a second command/address input buffer receiving the command/address signals via the second group of the pins;

a data input buffer receiving the data signals via the first group of the pins; and a data output buffer outputting the data signals via the second group of the pins.

3. The semiconductor memory device of claim 2, further comprising:

a memory core including a memory cell array and a sense amplifier;

a command/address decoder decoding a signal input to or output from the command/address input buffer; and a write/read pipeline unit transmitting signals input to or output from the data input buffer and the command/address decoder to the memory core, and transmitting data signals received from the memory core to the data output buffer.

4. The semiconductor memory device of claim 1, further comprising:

a command/address input buffer receiving the command/address signals via one of the first group of pins and the second group of pins;

a data input buffer receiving the data signals via the first group of pins; and a data output buffer outputting the data signals via the second group of pins.

5. The semiconductor memory device of claim 4, further comprising:

a memory core including a memory cell array and a sense amplifier;

a command/address decoder decoding signals input to or output from the. command/address input buffer; and a write/read pipeline unit transmitting signals input to or output from the data input buffer and the command/address decoder to the memory core, and transmitting data signals received from the memory core to the data output buffer.

6. A semiconductor memory device comprising:

a data input buffer receiving external data signals to be written to the semiconductor memory device;

a data output buffer outputting data signals read from the semiconductor memory device; and a command/address input buffer receiving command/address signals input to the semiconductor memory device, wherein both the data input buffer and the command/address input buffer receive data signals and control/address signals respectively on a common, first group of pins.

7. The semiconductor memory device of claim 6, wherein when data signals are output from the data output buffer, the first group of pins are used to receive the command/address signals.

8. The semiconductor memory device of claim 7, wherein the data input buffer and the command/address input buffer comprise a common input buffer.

9. The semiconductor memory device of claim 7, further comprising:

a memory core including a memory cell array and a sense amplifier;

a command/address decoder decoding signals input to or output from the command/address input buffer; and a write/read pipeline unit transmitting signals input to or output from the data input buffer and the command/address decoder to the memory core, and transmitting data signals received from the memory core to the data output buffer.

10. A semiconductor memory device comprising:

a data input buffer receiving external data signals to be written to the semiconductor memory device;

a data output buffer outputting data signals read from the semiconductor memory device; and a command/address input buffer receiving command/address signals input to the semiconductor memory device, wherein both the data output buffer and the command/address input buffer output data signals and receive command/address signals respectively on a common, first group of pins.

11. The semiconductor memory device of claim 10, wherein when data signals are input to the data input buffer, the first group of pins are used to receive the command/address signals.

12. The semiconductor memory device of claim 11, wherein each of the data input buffer and the command/address input buffer comprise a common input buffer.

13. The semiconductor memory device of claim 11, further comprising:

a memory core including a memory cell array and a sense amplifier;

a command/address decoder decoding signals input to or output from the command/address input buffer; and a write/read pipeline unit transmitting signals input to or output from the data input buffer and command/address decoder to the memory core, and transmitting data signals received from the memory core to the data output buffer.

14. A semiconductor memory device comprising:

a data input buffer receiving external data signals to be written to the semiconductor memory device;

a data output buffer outputting data signals read from the semiconductor memory device; and a first command/address input buffer and a second command/address input buffer receiving command/address signals input to the semiconductor memory device, wherein both the data input buffer and the first command/address input buffer receive data signals and command/address signals respectively on a common, first group of pins, and wherein both the data output buffer and the second command/address input buffer output data signals and receive command/address signals respectively on a common, second group of pins.

15. The semiconductor memory device of claim 14, wherein when data signals are received via the first group of pins, the command/address signals are received via the second group of pins, and when data signals are output via the second group of pins, the command/address signals are received via the first group of pins.

16. The semiconductor memory device of claim 15, further comprising:

a memory core including a memory cell array and a sense amplifier;

a command/address decoder decoding signals input to or output from the first and second command/address input buffers; and a write/read pipeline unit transmitting signals input to or output from the data input buffer and the command/address decoder to the memory core, and transmitting data signals received from the memory core to the data output buffer.

17. A semiconductor memory device comprising:

a data input buffer receiving external data signals to be written to the semiconductor memory device;

a data output buffer outputting data signals read from the semiconductor memory device;

a command/address input buffer receiving command/address signals input to the semiconductor memory device;

a first group of pins via which the command/address signals are received and via which data signals are received; and a second group of pins via which the command/address signals are received and via which data signals are output, wherein the command/address input buffer selectively receives the command/address signals received via one of the first group of pins and the second group of pins, wherein the first group of pins are connected to the data input buffer and the command/address input buffer, and wherein the second group of pins are connected to the data output buffer and the command/address input buffer.

18. The semiconductor memory device of claim 17, wherein when the data signals are received via the first group of pins, the command/address signals are received via the second group of pins, and when the data signals are output via the second group of pins, the command/address signals are received via the first group of pins.

19. The semiconductor memory device of claim 18, wherein each of the data input buffer and the command/address input buffer comprises a common input buffer.

20. The semiconductor memory device of claim 18, further comprising:

a memory core including a memory cell array and a sense amplifier;

a command/address decoder decoding signals input to or output from the command/address input buffer; and a write/read pipeline unit transmitting signals input to or output from the data input buffer and the command/address decoder to the memory core, and transmitting data signals received from the memory core to the data output buffer.

* * * * *